United States Patent
Lim (10) Patent No.: US 11,635,850 B2
(45) Date of Patent: Apr. 25, 2023

(54) DEVICE AND METHOD FOR DEGRADATION COMPENSATION OF AN AREA SELECTED FOR RUBBING

(71) Applicant: LX Semicon Co., Ltd., Daejeon (KR)

(72) Inventor: Ho Min Lim, Daejeon (KR)

(73) Assignee: LX SEMICON CO., LTD., Daejeon (KR)

(*) Notice: Subject to any disclaimer, the term of this patent is extended or adjusted under 35 U.S.C. 154(b) by 0 days.

(21) Appl. No.: 17/529,033

(22) Filed: Nov. 17, 2021

(65) Prior Publication Data

US 2022/0164061 A1 May 26, 2022

(30) Foreign Application Priority Data

Nov. 25, 2020 (KR) .................. 10-2020-0159806

(51) Int. Cl.
*G06F 3/041* (2006.01)
*G09G 3/3208* (2016.01)

(52) U.S. Cl.
CPC .......... *G06F 3/0418* (2013.01); *G06F 3/0412* (2013.01); *G09G 3/3208* (2013.01); *G09G 2320/0257* (2013.01); *G09G 2320/046* (2013.01)

(58) Field of Classification Search
CPC ............... G06F 3/0412; G09G 3/3208; G09G 2320/0257; G09G 2320/046
See application file for complete search history.

(56) References Cited

U.S. PATENT DOCUMENTS

| 2005/0104874 | A1  | 5/2005  | Koh |
|---|---|---|---|
| 2014/0118595 | A1* | 5/2014  | Jung .................. G06F 3/0481 348/333.01 |
| 2016/0063954 | A1* | 3/2016  | Ryu .................... H04N 7/18 345/589 |
| 2016/0291831 | A1* | 10/2016 | Baek .................. G06F 3/04847 |
| 2022/0139309 | A1* | 5/2022  | Ok ..................... G09G 3/3225 345/214 |
| 2022/0157275 | A1* | 5/2022  | Uchino ................ G09G 5/18 |

FOREIGN PATENT DOCUMENTS

| KR | 10-0756584 B1 | 9/2007 |
|---|---|---|
| KR | 10-2017-0081032 A | 7/2017 |
| KR | 10-1856928 B1 | 5/2018 |
| KR | 10-2271436 B1 | 7/2021 |
| WO | WO 2005/048230 A1 | 5/2005 |

* cited by examiner

*Primary Examiner* — Liliana Cerullo (74) *Attorney, Agent, or Firm* — Rothwell, Figg, Ernst & Manbeck, P.C.

(57) ABSTRACT

Provided are a data processing device, a display device, and deterioration compensation method of the data processing device to determine a burn-in occurrence region by recognizing a user's touch in a display device including a touch function and accurately perform a degradation compensation on the burn-in occurrence region.

14 Claims, 8 Drawing Sheets

DEVICE AND METHOD FOR DEGRADATION COMPENSATION OF AN AREA SELECTED FOR RUBBING

CROSS REFERENCE TO RELATED APPLICATION

This application claims priority from Korean Patent Application No. 10-2020-0159806, filed on Nov. 25, 2020 which is hereby incorporated by reference for all purposes as if fully set forth herein.

BACKGROUND OF THE DISCLOSURE

Field of the Disclosure

The present disclosure relates to a data processing device, a display device, and a degradation compensation method of the data processing device.

Related Art

Recently, with the development of multimedia, the importance of display devices has increased. Such display devices may be classified as liquid crystal display devices, organic light emitting display devices, and the like. Among them, the organic light emitting display devices have, which are self-luminous and have a wide viewing angle, have come into prominence as next-generation display devices.

In general, the organic light emitting display device includes a display panel including a plurality of pixels and a panel driver for driving each pixel to emit light.

Each pixel includes a switching transistor, a driving transistor, a capacitor, and an organic light emitting diode (OLED).

Here, the OLED, as an organic material, is naturally degraded due to electrical stress and with the lapse of a light emission time.

The degradation of the OLED has a non-linear characteristic and the degree of degradation varies depending on the electrical stress, causing a luminance deviation between adjacent pixels to make luminance non-uniform, and in particular, after the OLED is driven for a long period of time, a burn-in phenomenon such as an afterimage or color blurring occurs due to the degradation of the OLED.

One of the methods used to solve the burn-in phenomenon is to analyze image data input to a display device, determine the degree of degradation of the OLED through a sensing operation for each pixel, and perform compensation on a current, a voltage, or the like, internally in the display device.

However, the degree of burn-in phenomenon actually felt by a user outside the display device and the degree of burn-in phenomenon perceived inside the display device may be different from each other. Therefore, it is necessary to accurately compensate for a region in which a burn-in occurs perceived when the user actually looks at the display device from outside the display device.

SUMMARY OF THE DISCLOSURE

The present disclosure provides a technology of determining a burn-in occurrence region by recognizing a user's touch in a display device including a touch function and accurately performing degradation compensation on the burn-in occurrence region.

In an aspect, a data processing device includes a reception circuit configured to recognize user's rubbing on a screen, to specify a rub region in which the screen rubbing occurs in a touch display panel in which a plurality of pixels are arranged, and to subsequently receive sensing region data for a pixel sensing region including the rub region from an external device specifying the pixel sensing region, and a degradation compensation circuit configured to classify pixels arranged in the pixel sensing region as a sensing target using the sensing region data, to receive pixel sensing data for the sensing target from a pixel sensing device, to determine whether a burn-in occurs in the pixel sensing region using the pixel sensing data, and to perform a degradation compensation on the sensing target when it is determined that a burn-in occurs in the pixel sensing region.

In another aspect, a display device includes a touch driving device configured to recognize a user's touch on a touch display panel through a plurality of touch sensors arranged in the touch display panel, to generate touch data including touch coordinate information for the touch, and to transmit the generated touch data to an external device, a pixel sensing device configured to sense characteristic values of a plurality of pixels arranged in the touch display panel, and a data processing device configured to, when the external device determines that a rub region for a user's screen rubbing occurs on the touch display panel using the touch data, receive sensing region data for a pixel sensing region including the rub region from the external device, to classify pixels arranged in the pixel sensing region as a sensing target using the sensing region data, receive pixel sensing data including only characteristic values of the sensing target from the pixel sensing device, and to subsequently determine whether a burn-in occurs in the pixel sensing region using the pixel sensing data.

In the display device, the touch driving device may transmit one or more pieces of touch data to the external device for a predetermined period of time and the external device may determine whether a user's touch is continuously applied in a region of the touch display panel using the one or more pieces of touch data and, when it is determined that the user's touch is applied two or more times on one side and another side of the region, the external device specifies the region as the rub region.

In another aspect, a degradation compensation method of a data processing device includes a region information receiving operation in which when an external device receiving touch data from a touch driving device determines that a rub region for a user's screen rubbing occurs in a touch display panel using the touch data, sensing region data for a pixel sensing region including the rub region is received from the external device, a sensing region classifying operation in which pixels of the pixel sensing region are classified as a sensing target using the sensing region data, a partial sensing data receiving operation in which partial sensing data including only specific values of the sensing target is received from a pixel sensing device sensing characteristic values of a plurality of pixels arranged in the touch display panel, a degradation determining operation in which sensing data for comparison to be compared with the partial sensing data is selected among previously stored general sensing data including the characteristic values of the plurality of pixels and whether a burn-in occurs in the pixel sensing region is determined using the partial sensing data and the sensing data for comparison, and a degradation compensation operation in which a degradation compensation is performed on the sensing target when it is determined that a burn-in occurs in the pixel sensing region.

According to the present embodiment described above, since degradation compensation may be performed on a burn-in occurrence region of the touch display panel directly designated by the user through a touch operation, the degradation compensation may be accurately performed on the burn-in occurrence region.

DESCRIPTION OF EMBODIMENTS

Hereinafter, embodiments of the present disclosure will be described in detail with reference to the accompanying drawings. In adding reference numerals for elements in each figure, it should be noted that like reference numerals already used to denote like elements in other figures are used for elements wherever possible. Moreover, detailed descriptions related to well-known functions or configurations will be ruled out in order not to unnecessarily obscure subject matters of the present invention.

In describing the elements of the present invention, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present.

Figure 1:
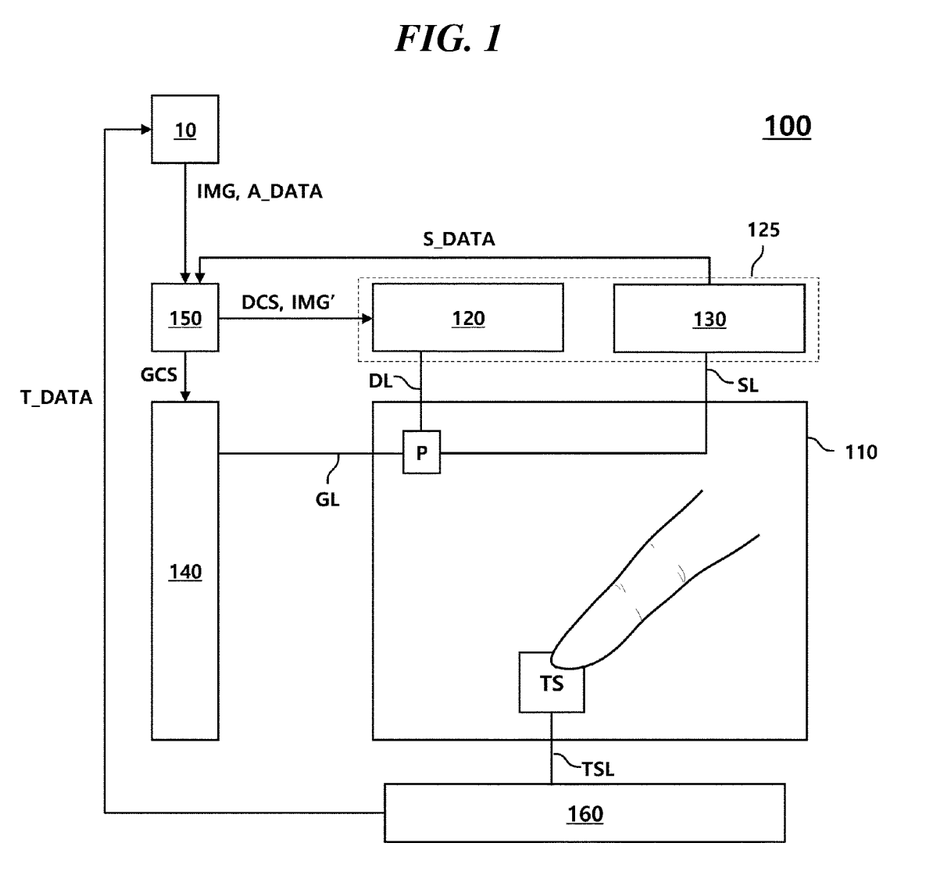
FIG. 1 is a block diagram of a display device according to an embodiment.

FIG. 1 is a block diagram of a display device according to an embodiment.

Referring to FIG. 1, a display device 100 may include a touch display panel 110 and panel driving devices 120, 130, 140, 150, and 160 for driving the touch display panel 110.

A plurality of data lines DL, a plurality of gate lines GL, a plurality of pixel sensing lines SL, and a plurality of touch sensing lines TSL are arranged on the touch display panel 110, and a plurality of pixels P and a plurality of touch sensors TS may be arranged on the touch display panel 110.

Devices 120, 130, 140, 150, and 160 for driving at least one component included in the touch display panel 110 may be referred to as panel driving devices. For example, a data driving device 120, a pixel sensing device 130, a gate driving device 140, a data processing device 150, a touch driving device 160, etc. may be referred to as the panel driving device.

Each of the devices 120, 130, 140, 150, and 160 mentioned above may be referred to as the panel driving device, and all or a plurality of devices may also be referred to as the panel driving device.

In the panel driving device, the gate driving device 140 may supply a scan signal of a turn-on voltage or a turn-off voltage to the gate line GL. When the scan signal of the turn-on voltage is supplied to the pixel P, the pixel P is connected to the data line DL, and when the scan signal of the turn-off voltage is supplied to the pixel P, the pixel P and the data line DL are disconnected.

In the panel driving device, the data driving device 120 supplies a data voltage to the data line DL. The data voltage supplied to the data line DL is transferred to the pixel P connected to the data line DL according to the scan signal.

In the panel driving device, the pixel sensing device 130 receives an analog signal (e.g., voltage, current, etc.) formed in each pixel P. The pixel sensing device 130 may be connected to each pixel P according to the scan signal or may be connected to each pixel P according to a separate sensing signal. In this case, the separate sensing signal may be generated by the gate driving device 140.

The pixels P may include an organic light emitting diode (OLED) and one or more transistors. Characteristics of the OLED and the transistors included in each pixel P may change according to time or a surrounding environment. The pixel sensing device 130 according to an embodiment may sense the characteristics of these components included in each pixel P and transmit the same to a data processing device 150 to be described later.

Figure 2:
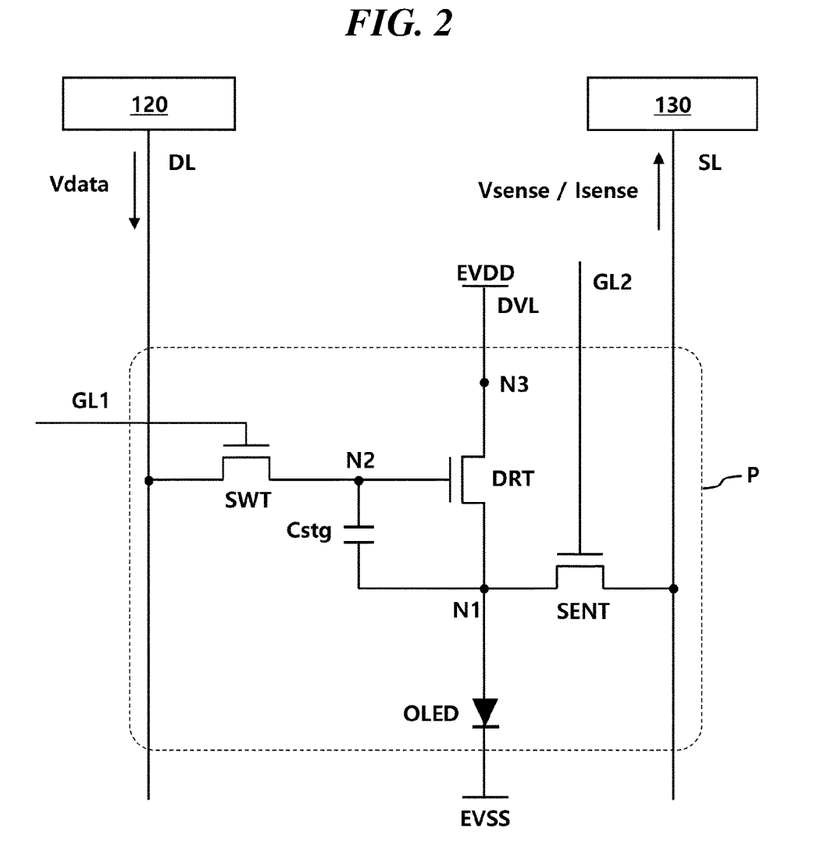
FIG. 2 is a diagram illustrating a structure of each pixel of FIG. 1, and signals input/output from a data driving device and a pixel sensing device to a pixel.

Specifically, the pixel P may include the OLED, a driving transistor DRT, a switching transistor SWT, a sensing transistor SENT, and a storage capacitor Cstg as shown in FIG. 2.

In addition, the OLED may include an anode electrode, an organic layer, and a cathode electrode. Under the control of the driving transistor DRT, the anode electrode is connected to a driving voltage EVDD side and the cathode electrode is connected to a base voltage EVSS to emit light. In other words, as the driving transistor DRT is turned on, a driving current is supplied from the driving voltage EVDD side so that the OLED may emit light and a voltage according to a characteristic of the OLED may be formed between the anode electrode and the cathode electrode.

The driving transistor DRT may control brightness of the OLED by controlling the driving current supplied to the OLED.

A first node N1 of the driving transistor DRT may be electrically connected to the anode electrode of the OLED and may be a source node or a drain node. A second node N2 of the driving transistor DRT may be electrically connected to a source node or a drain node of the switching transistor SWT and may be a gate node. A third node N3 of the driving transistor DRT may be electrically connected to a driving voltage line DVL supplying the driving voltage EVDD and may be a drain node or a source node.

The switching transistor SWT may be electrically connected between the data line DL and the second node N2 of the driving transistor DRT and may be turned on upon receiving a scan signal through the gate lines GL1 and GL2.

When the switching transistor SWT is turned on, a data voltage Vdata supplied from the data driving device 120 through the data line DL is transferred to the second node N2 of the driving transistor DRT.

The storage capacitor Cstg may be electrically connected between the first node N1 and the second node N2 of the driving transistor DRT.

The storage capacitor Cstg may be a parasitic capacitor existing between the first node N1 and the second node N2 of the driving transistor DRT or may be an external capacitor intentionally designed outside the driving transistor DRT.

The sensing transistor SENT connects the first node N1 of the driving transistor DRT to the sensing line SL, and the sensing line SL transfers a reference voltage Vref to the first node N1 and transfers an analog signal (e.g., voltage or current) formed at the first node N1 to the pixel sensing device 130.

In addition, the pixel sensing device 130 measures a characteristic of the pixel P using an analog signal Vsense or Isense transmitted through the sensing line SL.

When a voltage of the first node N1 is measured, a threshold voltage, mobility, and a current characteristic of the driving transistor DRT may be recognized. In addition, when the voltage of the first node N1 is measured, the degree of degradation of the OLED such as threshold voltage, parasitic capacitance, and a current characteristic of the OLED may be recognized.

The pixel sensing device 130 may measure the voltage of the first node N1, that is, the characteristic values of the pixels P and transmit pixel sensing data, which is digital data including the characteristic value, to the data processing device (150 of FIG. 1). In addition, the data processing device (150 of FIG. 1) may recognize the characteristic of each pixel P using the pixel sensing data.

In an embodiment, the pixel sensing device 130 may include a channel circuit arranged for each of the plurality of sensing lines SL. Here, the channel circuit may include at least one of a current integrating circuit, a current comparison circuit, and a sample and hold circuit. A switch may be disposed between the pixel P and the current integrating circuit or between the pixel P and the sample and hold circuit.

Meanwhile, in the panel driving device, the touch driving device 160 may supply a touch driving signal to the plurality of touch sensors TS disposed on the touch display panel 110. In addition, the touch driving device 160 may generate a touch sensing value for the touch sensor TS according to a reaction signal formed in the touch sensor TS in response to the touch driving signal. The touch driving device 160 may calculate touch coordinate information of an external object (e.g., a user's finger, etc.) using touch sensing values for the plurality of touch sensors TS, and transmit touch data including the touch coordinate information to a host 10 which is an external device. Here, the host 10 may be an application processor (AP) of a smartphone, a graphics processing unit (GPU) of a computer, or the like.

In the panel driving device, the data processing device 150 may supply various control signals to the gate driving device 140 and the data driving device 120. The data processing device 150 may generate a gate control signal GCS for starting a scan according to timing implemented in each frame and transmit the generated gate control signal CGS to the gate driving device 140. In addition, the data processing device 150 may output image data IMG' obtained by converting image data IMG input from the host 10, which is an external device, according to a data signal format used in the data driving device 120, to the data driving device 120. Also, the data processing device 150 may transmit a data control signal DCS for controlling the data driving device 120 to supply a data voltage to each pixel P according to each timing.

The data processing device 150 may compensate for the image data IMG' according to the characteristic of the pixel P and transmit the same. In this case, the data processing device 150 may receive pixel sensing data S_DATA from the pixel sensing device 130. The pixel sensing data S_DATA may include a characteristic value for the characteristic of the pixel P.

In general, the pixel sensing device 130 senses all of the plurality of pixels arranged entirely on the touch display panel 110, and the data processing device 150 periodically compensates for the image data IMG' using all the characteristic values of the plurality of pixels P.

In contrast, in an embodiment, when a user rubs a portion of the touch display panel 110 where a burn-in phenomenon such as an afterimage or color blurring occurs, a screen region rubbed by the user may be specified through touch data of the touch driving device 160 and the burn-in phenomenon of the corresponding screen region is accurately removed using only the characteristic values of the pixels P arranged in the corresponding screen region.

Figure 3:
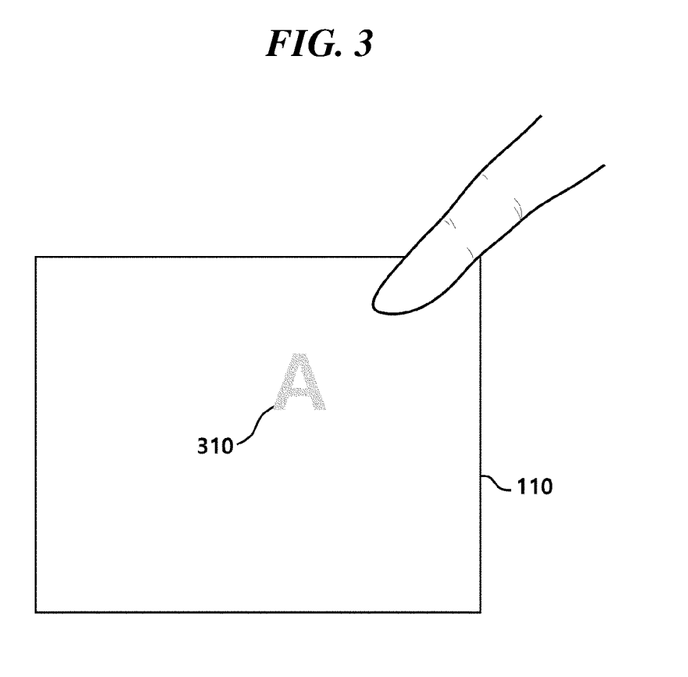
FIGS. 3 and 4 are views illustrating a configuration for determining of occurrence of a rub region in a display device according to an embodiment.
Figure 4:
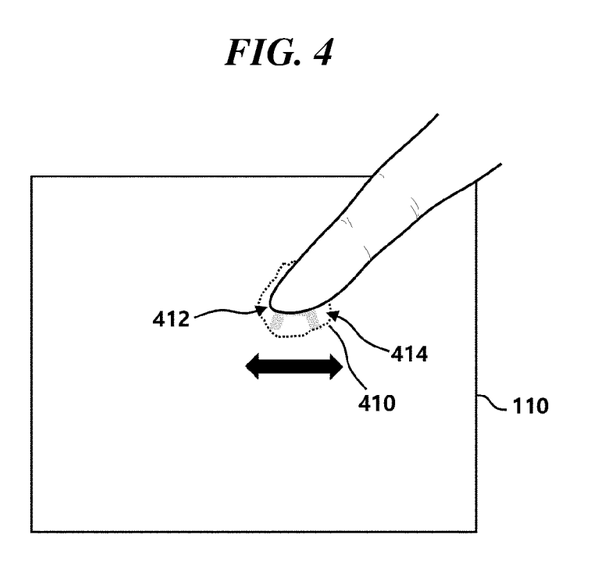

Specifically, if a burn-in region 310 in which a burn-in phenomenon corresponding to an afterimage occurs in the touch display panel 110 exists as shown in FIG. 3, the user, who is using the display device 100, may repeatedly rubs on the burn-in region 310 with his finger as shown in FIG. 4.

Here, the touch driving device 160 may generate a plurality of pieces of touch data for a rub region 410 including the burn-in region 310 as shown in FIG. 4 and transmit the generated touch data to the host 10 as an external device. Here, since the user's rubbing on the screen may be repeated for a predetermined period of time, the touch driving device 160 may generate and transmit the plurality of pieces of touch data to the host 10 for the predetermined period of time.

The host 10 receiving the touch data from the touch driving device 160 may recognize the user's repeated rubbing on the screen using the touch data.

The host 10 may specify the rub region 410 in which the screen rubbing occurred in the touch display panel 110. Here, the host 10 may receive a plurality of pieces of touch data for a predetermined period of time and determine whether the user's touch has been continuously applied in the rub region 410 corresponding in a region of the touch display panel 110 using the plurality of pieces of touch data. In this case, when it is determined that the user's touch has been applied two or more times in one side 412 and the other side 414 of the rub region 410, the host 10 may specify the region as the rub region 410.

Figure 5:
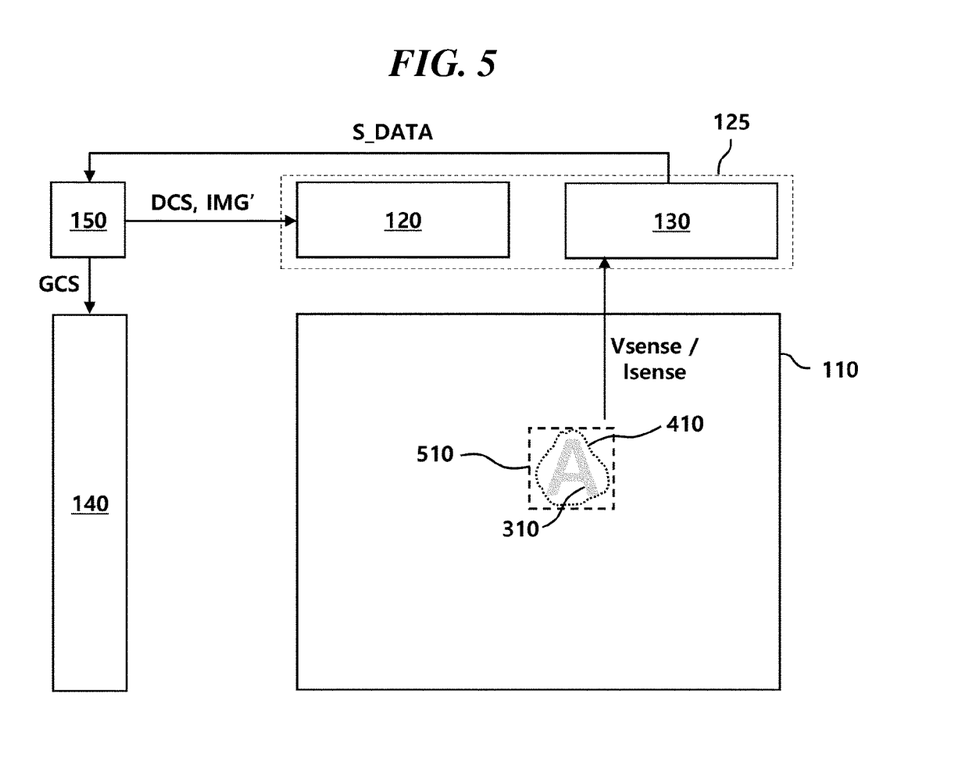
FIGS. 5 and 6 are views illustrating a configuration of determining whether a burn-in occurs and performing degradation compensation for burn-in in a data processing device according to an embodiment.

In addition, the host 10 may specify a pixel sensing region 510 including the rub region 410 as shown in FIG. 5, and generate sensing region data A_DATA for the pixel sensing region 510 and transmit the generated sensing region data A_DATA to the data processing device 150.

In an embodiment, the host 10 may specify the rub region 410 using pieces of touch coordinate information included in a plurality of pieces of touch data and may specify the pixel sensing region 510 using the pieces of touch coordinate information and arrangement information of the plurality of pixels P. Here, the arrangement information of the plurality of pixels P may include identification information on a sensing line SL or a sensing channel connected to each pixel P and identification information on the gate line GL connected to each pixel P.

The data processing device 150 may classify pixels arranged in the pixel sensing region 510 as a sensing target using the sensing region data A_DATA received from the host 10 which is an external device. In other words, the data processing device 150 may generate a switching signal or control data that allows the pixel sensing device 130 to sense only the pixels arranged in the pixel sensing region 510 and transmit the generated switching signal or control data directly to the pixel sensing device 130 or may transmit the switching signal or control data via the data driving device 120.

Through this, the data processing device 150 may receive partial sensing data which is pixel sensing data including only characteristic values of the sensing target from the pixel sensing device 130.

In general, the pixel sensing device 130 senses all of the plurality of pixels arranged entirely on the touch display panel 110.

However, in an embodiment, when the data processing device 150 classifies the pixels arranged in the pixel sensing region 510 as a sensing target, the pixel sensing device 130 may sense only pixels corresponding to the sensing target, rather than sensing all of the plurality of pixels.

The data processing device 150 receiving the partial sensing data may determine whether burn-in occurs in the pixel sensing region 510 using the partial sensing data.

In an embodiment, the data processing device 150 may previously store general sensing data which is pixel sensing data for a plurality of pixels before receiving the partial sensing data from the pixel sensing device 130.

In other words, before the data processing device 150 receives the sensing region data A_DATA from the host 10, the pixel sensing device 130 may sense all of the plurality of pixels and the data processing device 150 may receive general sensing data for the plurality of pixels from the pixel sensing device 130 and store the received general sensing data.

Meanwhile, when the display panel 110 is released, the pixel sensing device 130 may sense all the plurality of pixels included in the display panel 110 and transmit initial sensing data, which is the pixel sensing data, to the data processing device 150. In addition, the data processing device 150 may store the initial sensed data received from the pixel sensing device 130. Here, the initial sensing data may include initial characteristic values that are characteristic values when a degradation does not start in each of the plurality of pixels.

In an embodiment, the data processing device 150 may select sensing data for comparison to be compared with the partial sensing data from one or more of the previously stored general sensing data and the previously stored initial sensing data.

When the data processing device 150 selects the sensing data for comparison from the general sensing data, the sensing data for comparison may include the characteristic values of the comparison target pixels arranged in the peripheral region (610 of FIG. 6) of the pixel sensing region 510. Here, the comparison target pixels arranged in the peripheral region 610 may be in a state in which degradation has progressed to some extent depending on a usage period of the display device 100, but the degree of degradation thereof may be significantly lower than that of the sensing target disposed in the pixel sensing region 510.

When the data processing device 150 selects the sensing data for comparison from the initial sensing data, the sensing data for comparison may include initial characteristic values of the sensing target disposed in the pixel sensing region 510.

Figure 6:
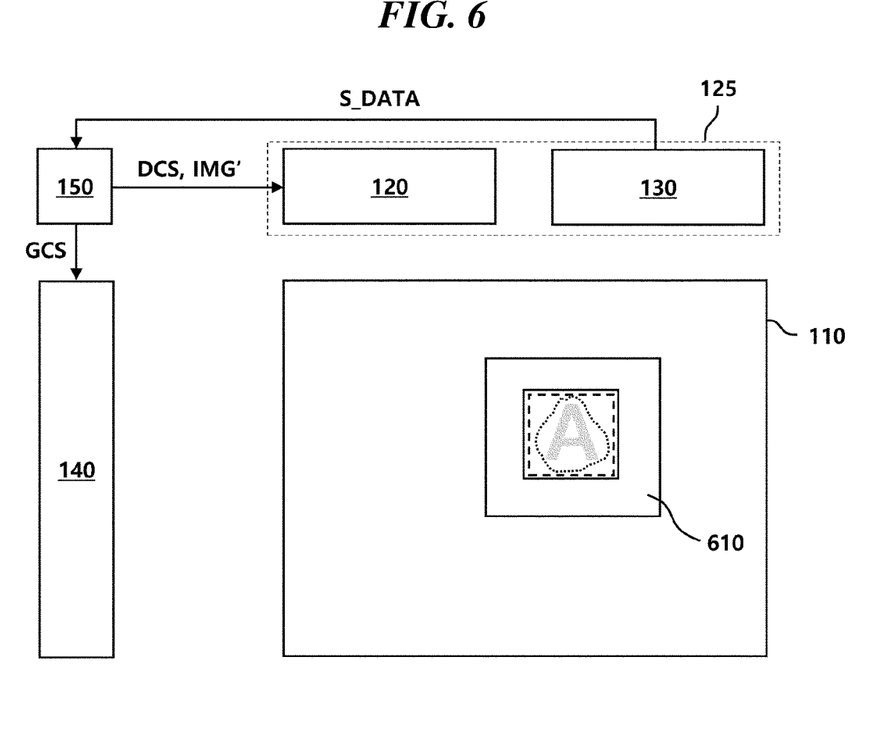

When the data processing device 150 selects the sensing data for comparison from the general sensing data and the initial sensing data, the sensing data for comparison may include characteristic values of the comparison target pixels arranged in the peripheral region 610 and initial characteristic values of the sensing target disposed in the pixel sensing region 510.

When the sensing data for comparison includes characteristic values of the comparison target pixels, the data processing device 150 may compare the characteristic values included in the partial sensing data, that is, the characteristic values of the sensing target with the characteristic values of the comparison target pixels included in the sensing data for comparison.

When a difference between the characteristic values of the sensing target and the characteristic values of the comparison target pixels is equal to or greater than a first reference as a result of comparison therebetween, the data processing device 150 may determine that a burn-in such as an afterimage or color blurring occurs in the pixel sensing region 510.

For example, when the degree of degradation of the pixels corresponding to the sensing target is greater than the degree of degradation of the comparison target pixels arranged in the peripheral region 610, the difference between the characteristic values of the sensing target and the characteristic values of the comparison target pixels may be equal to or greater than the first reference, and thus, a possibility that a burn-in occurs in the pixel sensing region 510 may increase.

Accordingly, when the difference between the characteristic values of the sensing target and the characteristic values of the comparison target pixels is equal to or greater than the first reference, the data processing device 150 determines that a burn-in occurs in the pixel sensing region 510. Here, the data processing device 150 may calculate an average value of the characteristic values of the sensing target and an average value of the characteristic values of the comparison target pixels, and when a difference between the two average values is equal to or greater than the first reference, the data processing device 150 may determine that a burn-in occurs in the pixel sensing region.

When the sensing data for comparison includes initial characteristic values of the sensing target disposed in the pixel sensing region 510, the data processing device 150 may compare the characteristic values of the sensing target included in the partial sensing data with the initial characteristic values included in the sensing data for comparison. Here, the data processing device 150 may calculate an average value of the characteristic values of the sensing target and an average value of the initial characteristic values and subsequently compare the two average values.

When the difference between the characteristic values of the sensing target and the initial characteristic values included in the sensing data for comparison is equal to or greater than a second reference as a result of a comparison therebetween, the data processing device 150 may determine that a burn-in such as an afterimage or color blurring occurs in the pixel sensing region 510. Here, the second reference may be greater than or equal to the first reference.

When the sensing data for comparison includes the characteristic values of the comparison target pixels and the initial characteristic values of the sensing target, the data processing device 150 may compare the characteristic values of the sensing target with the characteristic values of the comparison target pixels and compare the characteristic values of the sensing target with the initial characteristic values.

When the difference between the characteristic values of the sensing target and the characteristic values of the comparison target pixels is equal to or greater than the first reference and the difference between the characteristic values of the sensing target and the initial characteristic values thereof is equal to or greater than the second reference as a result of comparison, the data processing device 150 may be determined that a burn-in such as an afterimage or color blurring occurs in the pixel sensing region 510.

After determining that a burn-in occurs in the pixel sensing region 510 as described above, the data processing device 150 may perform a degradation compensation on the sensing target, which is the pixels arranged in the pixel sensing region 510, that is, the pixel sensing region 510.

Specifically, the data processing device 150 may store a look-up table (LUT) including compensation values for a plurality of pixels and may correct compensation values for a sensing target in the look-up table. Here, the data processing device 150 may correct compensation values for the sensing target using the characteristic values of the sensing target included in the partial sensing data.

After correcting the look-up table, the data processing device 150 may remove the burn-in existing in the pixel sensing region 510 by applying the compensation values of the look-up table to the image data IMG' to be transmitted to the data driving device 120.

As described above, since the data processing device 150 may concentratedly compensate for the degradation only for the burn-in occurrence region of the touch display panel 110 directly designated by the user through a touch operation, the degradation compensation for the burn-in occurrence region may be accurately performed only in the region desired by the user, compared to the general method of determining whether a burn-in occurs and performing degradation compensation in the display device 100.

Hereinafter, a configuration of the data processing device 150 for determining the burn-in occurrence region and compensating for a degradation and a method of compensating for a degradation are described.

Figure 7:
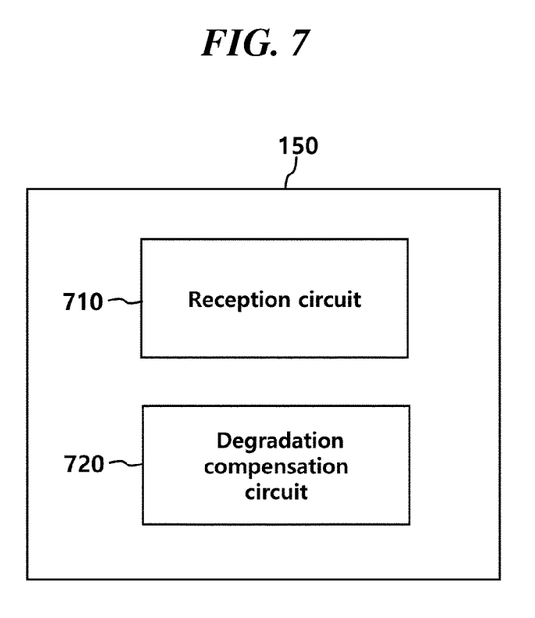
FIG. 7 is a block diagram of a data processing device according to an embodiment.

FIG. 7 is a block diagram of the data processing device according to an embodiment.

Referring to FIG. 7, the data processing device 150 may include a reception circuit 710 and a degradation compensation circuit 720.

The reception circuit 710 receives image data from the host 10 which is an external device.

Also, the reception circuit 710 may receive sensing region data A_DATA for the pixel sensing region 510 from the host 10. Here, the host 10 may recognize the user's repeated rubbing on the screen using touch data received from the touch driving device 160. In addition, the host 10 may specify the pixel sensing region 510 including the rub region 410 after specifying the rub region 410 in which the screen rubbing occurs in the touch display panel 110.

Thereafter, the host 10 may generate sensing region data for the pixel sensing region 510 and transmit the generated sensing region data to the reception circuit 710 of the data processing device 150.

The degradation compensation circuit 720 may classify pixels arranged in the pixel sensing region 510 as a sensing target using the sensing region data A_DATA. Here, the classifying of the sensing target means that the degradation compensation circuit 720 generates a switching signal or control data allowing the pixel sensing device 130 to sense only the pixels arranged in the pixel sensing region 510 and directly transmit the generated switching signal or control data to the pixel sensing device 130 or via the data driving device 120.

The degradation compensation circuit 720 may receive partial sensing data, which is pixel sensing data for the sensing target, and determine whether a burn-in occurs in the pixel sensing region 510 using the partial sensing data.

Here, the degradation compensation circuit 720 may receive the partial sensing data in a state in which one or more of the general sensing data and the initial sensing data is previously stored.

The degradation compensation circuit 720 may select sensing data for comparison to be compared with the partial sensing data from at least one of previously stored general sensing data and previously stored initial sensing data.

Thereafter, the degradation compensation circuit 720 may compare the characteristic values included in the partial sensing data with the characteristic values included in the sensing data for comparison. Here, the characteristic values included in the partial sensing data may be characteristic values of the sensing target, and the characteristic values included in the sensing data for comparison may include one or more of the characteristic values of pixels to be compared and the initial characteristic values of the sensing target.

When the difference between the characteristic values included in the partial sensing data and the characteristic values included in the sensing data for comparison is equal to or greater than a predetermined reference as a result of comparison, the degradation compensation circuit 720 may determine that a burn-in occurs in the pixel sensing region 510 and may perform a degradation compensation on the pixel sensing region 510, that is, the sensing target.

In an embodiment, the degradation compensation circuit 720 may previously store a look-up table including compensation values for a plurality of pixels and may correct compensation values for the sensing target in the look-up table. Here, the degradation compensation circuit 720 may correct the compensation value for the sensing target using the characteristic values of the sensing target.

After correcting the look-up table, the degradation compensation circuit 720 may accurately remove the burn-in existing in the pixel sensing region 510 by applying the compensation values of the look-up table to the image data IMG' to be transmitted to the data driving device 120.

Figure 8:
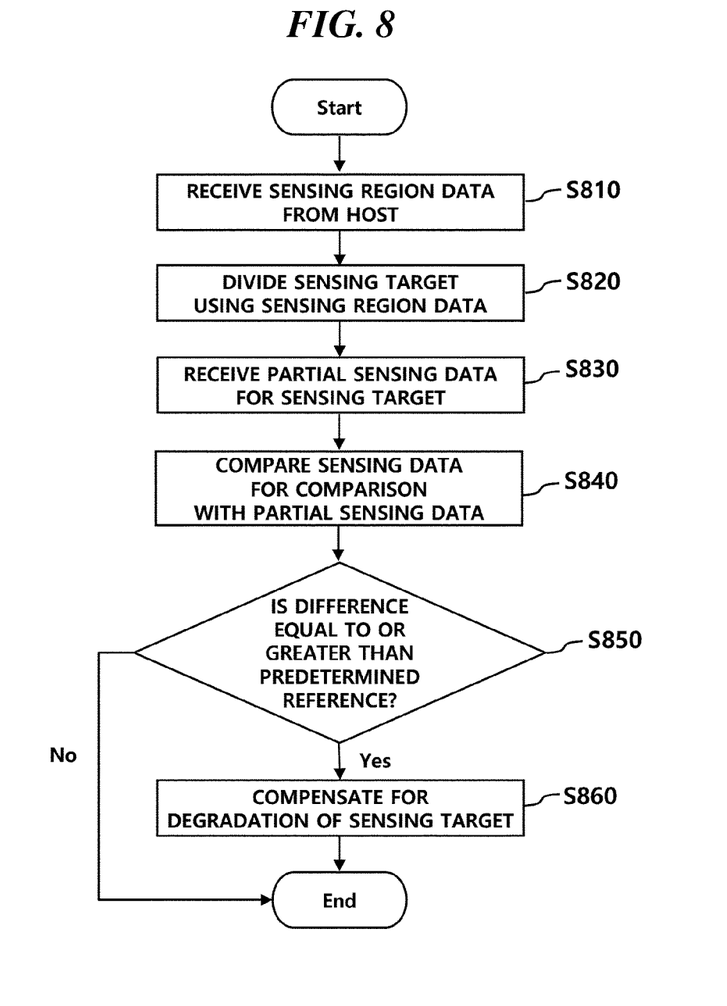
FIG. 8 is a flowchart illustrating a process of performing degradation compensation for burn-in in a data processing device according to an embodiment.

FIG. 8 is a flowchart illustrating a process of performing degradation compensation on a burn-in in the data processing device according to an embodiment.

First, the data processing device 150 may receive the sensing region data A_DATA from the host 10 which is an external apparatus (S810). Here, the host 10 may determine that the rub region 410 for the user's screen rubbing is generated in the touch display panel 110 using the touch data received from the touch driving device 160. In this case, the host 10 may generate the sensing region data A_DATA and transmit the generated sensing region data A_DATA to the data processing device 150.

The data processing device 150 receiving the sensing region data may classify the pixels arranged in the pixel sensing region 510 as a sensing target, and receive partial sensing data including only characteristic values of the sensing target from the pixel sensing device 130 (S820 and S830).

The data processing device 150 may select sensing data for comparison from one or more of the previously stored general sensing data and the previously stored initial sensing data and may compare the partial sensing data with the sensing data for comparison (S840).

When a difference between the characteristic values included in the partial sensing data and the characteristic values included in the sensing data for comparison is equal to or greater than a predetermined reference as a result of comparing the partial sensing data and the sensing data for comparison, the data processing device 150 may determine that a burn-in such as an afterimage or color blurring occurs in the pixel sensing region 510 and perform a degradation compensation on the sensing target (S850 and S860). Here, the characteristic values included in the sensing data for comparison may include one or more of characteristic values of the comparison target pixels arranged in the peripheral region 610 of FIG. 6 and initial characteristic values of the sensing target.

In step S860, the data processing device 150 may correct only compensation values for the sensing target in the previously stored look-up table and subsequently apply compensation values included in the look-up table to the image data IMG'. Here, the data processing device 150 may correct the compensation values for the sensing target using the characteristic values of the sensing target included in the partial sensing data.

Meanwhile, when the difference between the characteristic values included in the partial sensing data and the characteristic values included in the sensing data for comparison is less than the predetermined reference in step S850, the data processing device 150 may not perform a degradation compensation on the sensing target. In other words, the configuration for correcting compensation values on the sensing target in the look-up table may not be implemented.

In the above, it is described that the determining of whether a burn-in occurs and degradation compensation are performed by the data processing device 150, but the embodiment is not limited thereto and the host 10 may determine whether a burn-in occurs and perform a degradation compensation.

What is claimed is:

1. A data processing device comprising:
a reception circuit configured to recognize user's rubbing on a screen, to specify a rub region in which the screen rubbing occurs in a touch display panel in which a plurality of pixels are arranged, and to subsequently receive sensing region data for a pixel sensing region including the rub region from an external device specifying the pixel sensing region; and
a degradation compensation circuit configured to classify pixels arranged in the pixel sensing region as a sensing target using the sensing region data, to receive pixel sensing data for the sensing target from a pixel sensing device, to determine whether a burn-in occurs in the pixel sensing region using the pixel sensing data, and to perform a degradation compensation on the sensing target when it is determined that a burn-in occurs in the pixel sensing region.

2. The data processing device of claim 1, wherein the degradation compensation circuit is configured to previously store general sensing data which is pixel sensing data for all of the plurality of pixels, before receiving the pixel sensing data from the pixel sensing device.

3. The data processing device of claim 2, wherein the degradation compensation circuit is configured to select sensing data for comparison to be compared with the pixel sensing data among the general sensing data and to determine whether a burn-in occurs in the pixel sensing region using the pixel sensing data and the sensing data for comparison.

4. The data processing device of claim 3, wherein
the pixel sensing data includes characteristic values of the sensing target, the sensing data for comparison includes characteristic values of comparison target pixels arranged in a peripheral region of the pixel sensing region, and the degradation compensation circuit determines that a burn-in occurs in the pixel sensing region when a difference between the characteristic values of the sensing target and the characteristic values of the comparison target pixels is equal to or greater than a predetermined reference.

5. The data processing device of claim 1, wherein the degradation compensation circuit is configured to previously store a look-up table including compensation values for the plurality of pixels.

6. The data processing device of claim 5, wherein the pixel sensing data includes characteristic values of the sensing target and the degradation compensation circuit corrects compensation values for the sensing target in the look-up table using the characteristic values.

7. A display device comprising:
a touch driving device configured to recognize a user's touch on a touch display panel through a plurality of touch sensors arranged in the touch display panel, to generate touch data including touch coordinate information for the touch, and to transmit the generated touch data to an external device;
a pixel sensing device configured to sense characteristic values of a plurality of pixels arranged in the touch display panel; and
a data processing device configured to, when the external device determines that a rub region for a user's screen rubbing occurs on the touch display panel using the touch data, receive sensing region data for a pixel sensing region including the rub region from the external device, to classify pixels arranged in the pixel sensing region as a sensing target using the sensing region data, to receive pixel sensing data including only characteristic values of the sensing target from the pixel sensing device, and to subsequently determine whether a burn-in occurs in the pixel sensing region using the pixel sensing data.

8. The display device of claim 7, wherein
the touch driving device transmits one or more pieces of touch data to the external device for a predetermined period of time, and
the external device determines whether a user's touch is continuously applied in a region of the touch display panel using the one or more pieces of touch data and, when it is determined that the user's touch is applied two or more times on one side and another side of the region, the external device specifies the region as the rub region.

9. The display device of claim 7, wherein
the data processing device previously stores general sensing data, which is sensing data for all of the plurality of pixels, before receiving the pixel sensing data, selects sensing data for comparison to be compared with the pixel sensing data among the general sensing data after receiving the pixel sensing data, and determines whether a burn-in occurs in the pixel sensing region using the pixel sensing data and the sensing data for comparison.

10. The display device of claim 9, wherein
the sensing data for comparison includes characteristic values of comparison target pixels arranged in a peripheral region of the pixel sensing region, and
the data processing device determines that a burn-in occurs in the pixel sensing region when a difference between the characteristic values of the sensing target and the characteristic values of the comparison target pixels is equal to or greater than a predetermined reference.

11. The display device of claim 10, wherein the data processing device corrects compensation values of the sensing target in a look-up table including compensation values for the plurality of pixels.

12. A degradation compensation method of a data processing device, the degradation compensation method comprising:
- a region information receiving operation in which, when an external device receiving touch data from a touch driving device determines that a rub region for a user's screen rubbing occurs in a touch display panel using the touch data, sensing region data for a pixel sensing region including the rub region is received from the external device;
- a sensing region classifying operation in which pixels of the pixel sensing region are classified as a sensing target using the sensing region data;
- a partial sensing data receiving operation in which partial sensing data, including only characteristic values of the sensing target, is received from a pixel sensing device sensing characteristic values of a plurality of pixels arranged in the touch display panel;
- a degradation determining operation in which sensing data for comparison to be compared with the partial sensing data is selected among previously stored general sensing data including the characteristic values of the plurality of pixels and whether a burn-in occurs in the pixel sensing region is determined using the partial sensing data and the sensing data for comparison; and
- a degradation compensation operation in which a degradation compensation is performed on the sensing target when it is determined that a burn-in occurs in the pixel sensing region.

13. The degradation compensation method of claim 12, wherein,
in the degradation compensation operation, the sensing data for comparison includes characteristic values of comparison target pixels arranged in a peripheral region of the pixel sensing region, and
the data processing device determines that a burn-in occurs in the pixel sensing region when a difference between the characteristic values of the sensing target and the characteristic values of the comparison target pixels is equal to or greater than a predetermined reference.

14. The degradation compensation method of claim 12, wherein,
in the degradation compensation operation,
compensation values of the sensing target are corrected in a look-up table including compensation values for the plurality of pixels and the burn-in of the pixel sensing region is removed by applying the look-up table to processed image data received from the external device.

* * * * *